(12) United States Patent
Abe et al.

(10) Patent No.: US 9,257,183 B2
(45) Date of Patent: Feb. 9, 2016

(54) SEMICONDUCTOR STORAGE DEVICE HAVING NAND-TYPE FLASH MEMORY

(71) Applicant: KABUSHIKI KAISHA TOSHIBA, Tokyo (JP)

(72) Inventors: Kenichi Abe, Kanagawa (JP); Takuya Futatsuyama, Kanagawa (JP); Masanobu Shirakawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/474,043

(22) Filed: Aug. 29, 2014

(65) Prior Publication Data

US 2015/0194216 A1 Jul. 9, 2015

(30) Foreign Application Priority Data

Jan. 7, 2014 (JP) ................................. 2014-001200

(51) Int. Cl.
*G11C 16/04* (2006.01)
*G11C 16/10* (2006.01)
*G11C 16/26* (2006.01)
*G11C 16/32* (2006.01)

(52) U.S. Cl.
CPC ............ *G11C 16/0483* (2013.01); *G11C 16/10* (2013.01); *G11C 16/26* (2013.01); *G11C 16/32* (2013.01)

(58) Field of Classification Search
CPC . G11C 16/0483; G11C 11/5628; G11C 16/32
USPC ........................... 365/185.05, 185.17, 185.18
See application file for complete search history.

(56) References Cited

U.S. PATENT DOCUMENTS

| 8,551,838 | B2 | 10/2013 | Kito et al. | |
|---|---|---|---|---|
| 2007/0047313 | A1* | 3/2007 | Hosono | G11C 11/5628 365/185.17 |
| 2013/0148430 | A1* | 6/2013 | Shiino | G11C 16/10 365/185.18 |
| 2013/0201762 | A1* | 8/2013 | Izumi | G11C 16/0483 365/185.17 |
| 2014/0063972 | A1* | 3/2014 | Maeda | G11C 16/0483 365/185.22 |
| 2015/0187425 | A1* | 7/2015 | Nam | G11C 16/14 365/185.2 |

* cited by examiner

*Primary Examiner* — Tuan T Nguyen
(74) *Attorney, Agent, or Firm* — Patterson & Sheridan, LLP

(57) ABSTRACT

A semiconductor storage device includes a plurality of memory cell transistors that are connected to each other in series, a plurality of word lines that are connected to the plurality of memory cell transistors, and a control circuit. The control circuit applies a first potential to a selected one of the plurality of word lines. The control circuit applies a second potential that is higher than the first potential to the word lines that are not selected at different timings before the first potential is applied to the selected word line.

13 Claims, 12 Drawing Sheets

SEMICONDUCTOR STORAGE DEVICE HAVING NAND-TYPE FLASH MEMORY

CROSS-REFERENCE TO RELATED APPLICATION

This application is based upon and claims the benefit of priority from Japanese Patent Application No. 2014-001200, filed Jan. 7, 2014, the entire contents of which are incorporated herein by reference.

FIELD

Embodiments described herein relate generally to a semiconductor storage device.

BACKGROUND

A NAND-type flash memory having a three-dimensional structure is known in the related art.

DETAILED DESCRIPTION

According to an embodiment, there is provided a semiconductor storage device which may suppress excessive potential increases.

In general, according to one embodiment, a semiconductor storage device includes: a plurality of memory cell transistors that are connected to each other in series; a plurality of word lines that are connected to the plurality of memory cell transistors; and a control circuit that applies a first potential to a selected one of the plurality of word lines, applies a second potential that is higher than the first potential to the word lines that are not selected at different timings before the first potential is applied to the selected word line.

Embodiments are explained by reference to the drawings. In the explanation given hereinafter, elements having substantially identical functions or configurations are given same symbols, and the elements are described repeatedly only when such explanation is necessary. The drawings are shown as schematic diagrams. In each embodiment, a device and a method for embodying the technical concepts and features disclosed herein are provided as examples, and the technical concepts and features disclosed herein are not limited to materials, shapes, structures, arrangement and the like of the embodiments described below.

First Embodiment

Figure 1:
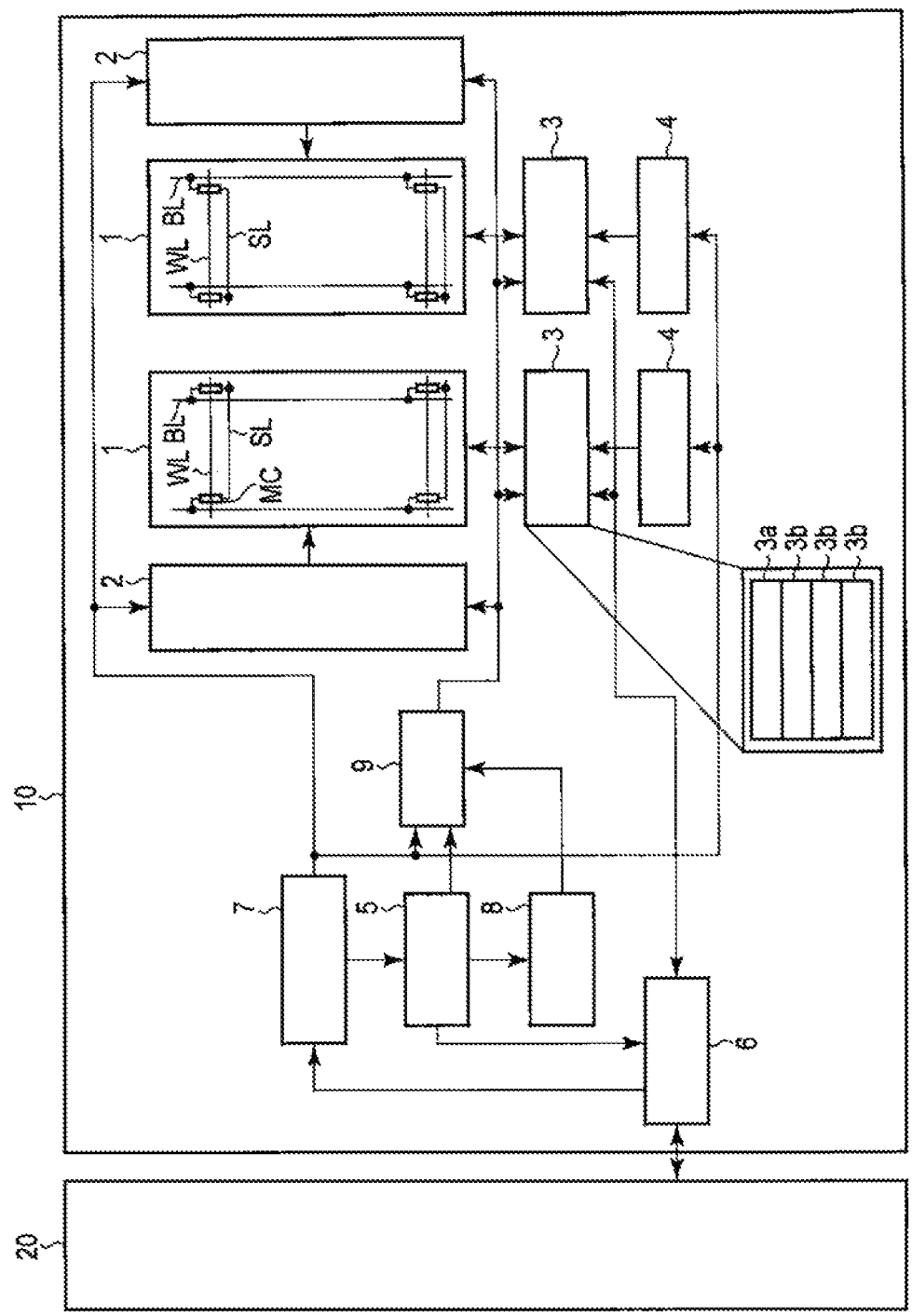
FIG. 1 is a block diagram of a semiconductor storage device according to a first embodiment.

FIG. 1 is a block diagram of a semiconductor storage device 10 according to a first embodiment. FIG. 1 also shows a memory controller 20 which communicates with the semiconductor storage device 10. In general, it is not necessary for the respective functional blocks to be differentiated from each other as in the example described below. Some functions may be executed by functional blocks different from the functional blocks depicted in the example. Further, any of the functional blocks may be divided into smaller functional sub-blocks.

The semiconductor storage device 10 includes elements such as memory cell arrays 1, row decoders 2, data circuit and page buffers 3, column decoders 4, a control circuit 5, an input and output circuit 6, an address and command register 7, a voltage generating circuit 8, and a core driver 9.

The semiconductor storage device 10 includes a plurality of memory cell arrays (e.g., two memory cell arrays) 1. The memory cell array 1 may be also referred to as "plane". The memory cell array 1 includes a plurality of memory blocks (physical blocks). Each memory block includes a plurality of memory cells MC, word lines WL, bit lines BL, source lines SL and the like.

A set including the row decoder 2, the data circuit and page buffer 3 and the column decoder 4 is provided for every memory cell array 1. The row decoder 2 receives a block address signal or the like from the address and command register 7, and receives a word line voltage and a selection gate voltage from the core driver 9. The row decoder 2 selects a memory block, a word line or the like based on the received block address signal, the received word line control signal and the received selection gate line control signal.

The data circuit and page buffer 3 temporarily holds data read from the memory cell array 1, receives write data from outside the semiconductor storage device 10, and writes the received data into the selected memory cell MC. The data circuit and page buffer 3 includes a sense amplifier 3a. The sense amplifier 3a includes a plurality of sense amplifier units connected to a plurality of bit lines BL respectively, reads data in the memory cells MC through the bit lines BL, and detects a state of the memory cells MC through the bit lines BL. The semiconductor storage device 10 may hold data of 2 bits or more in one memory cell MC. Accordingly, the data circuit and page buffer 3 includes three data caches 3b, for example. The first data cache 3b holds either one of low-order page data and upper-order page data, and the second data cache 3b holds the other of the low-order page data and the upper-order page data. The low-order page data is formed of a set of low-order bits out of respective 2 bit data of a plurality of relevant memory cells. The upper-order page data is formed of a set of upper-order bits out of respective 2 bit data of a plurality of relevant memory cells. The third data cache 3b holds temporary data written in the memory cell again based on a result of verification reading, for example.

The column decoder 4 receives a column address signal from the address and command register 7, and decodes the received column address signal. The column decoder 4 controls inputting and outputting of data into and from the data circuit and page buffer 3 based on the decoded address signal.

The control circuit 5 receives a command which instructs reading, writing, erasing or the like from the address and command register 7. The control circuit 5 controls the voltage generating circuit 8 and the core driver 9 based on the command in accordance with a predetermined sequence. The voltage generating circuit 8 generates various voltages (potentials) in accordance with an instruction from the control circuit 5. The core driver 9, in accordance with an instruction from the control circuit 5, controls the row decoder 2 and the data circuit and page buffer 3 for controlling the word line WL and the bit line BL. The input and output circuit 6 controls inputting of commands, addresses and data from the memory controller 20 and outputting of the commands, the addresses and the data to the memory controller 20.

Figure 2:
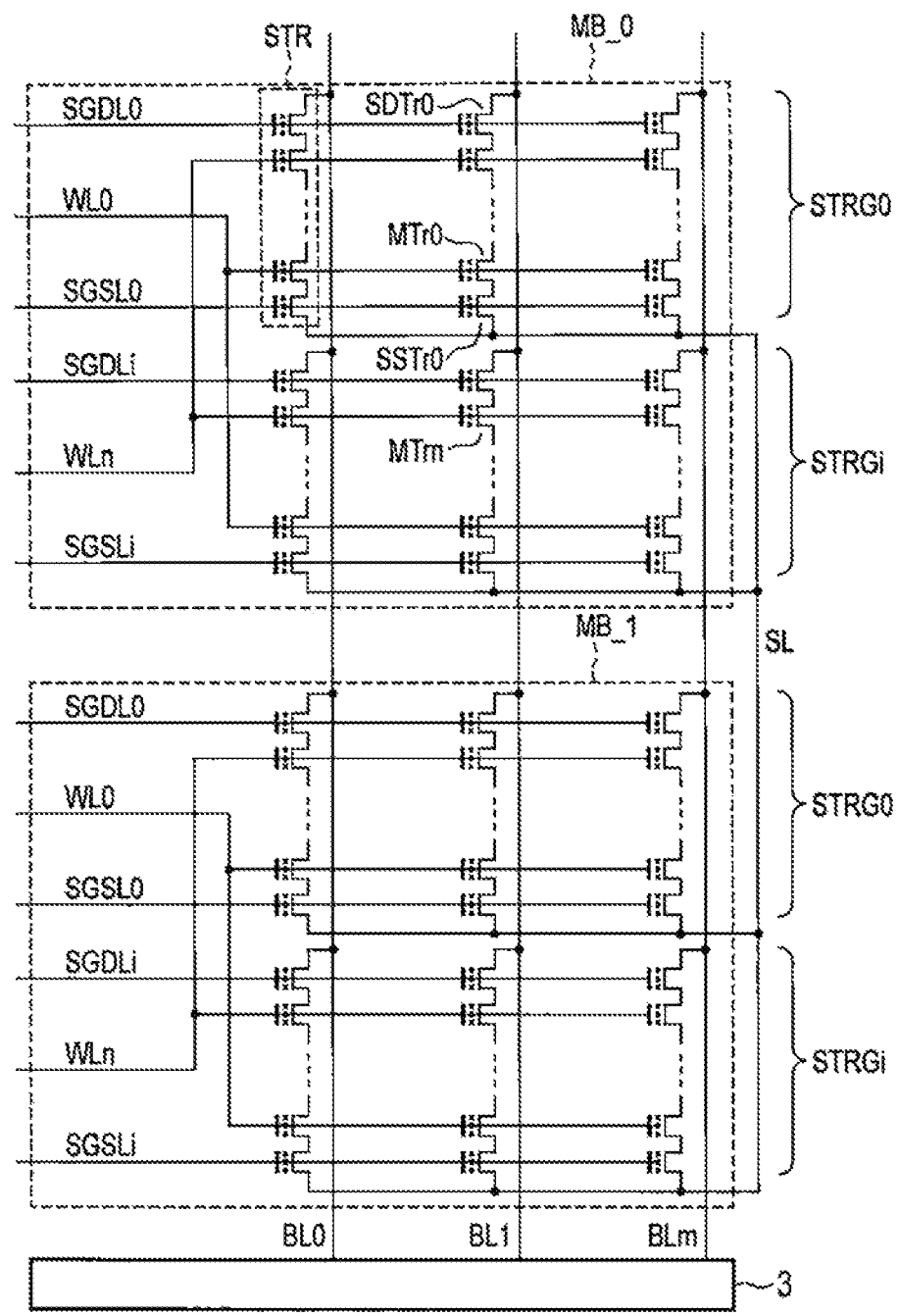
FIG. 2 is a circuit diagram of a part of a memory cell array according to the first embodiment.

The memory cell array 1 includes the elements and connections shown in FIG. 2. FIG. 2 is a circuit diagram of a part (two memory blocks MB) of the memory cell array 1 according to the first embodiment. As shown in FIG. 2, the memory cell array 1 includes a plurality of bit lines BL, source (cell source) lines SL, and a plurality of memory blocks MB. In each memory block MB, (i+1) pieces of strings STR are connected to one bit line BL.

One string STR includes (N+1) pieces (N: 47, for example) of memory cell transistors MTr0 to MTr47 which are connected in series, a source-side selection gate transistor SSTr, and a drain-side selection gate transistor SDTr. When it is unnecessary to differentiate reference symbols (for example, cell transistor MTr) accompanied with numeral at the end thereof from each other, the reference symbol with the numeral at the end is omitted is used, and this indicates all reference symbols accompanied with numeral.

In each string STR, a drain of the transistor SSTr is connected to a source of the cell transistor MTr0. A source of the transistor SDTr is connected to a drain of the cell transistor MTr47. A source of the transistor SSTr is connected to the source line SL. A drain of the transistor SDTr is connected to one bit line BL corresponding to the transistor SDTr. A region between the respective elements is provided with an interlayer insulation film.

The plurality of strings STR arranged parallel to each other along the direction that the word lines WL extend constitute a string group STRG. For example, all of the plurality of strings STR arranged parallel to each other along the direction that the word lines WL extend and are respectively connected to all bit lines BL, constitute one string group STRG. In each string group STRG, respective gates of the respective cell transistors MTr0 of the plurality of strings STR are connected to the word line WL0 in common. In the same manner, in each string group STRG, respective gates of the respective cell transistors MTrX (X: integer of 0 to N) of the plurality of strings STR are connected to the word line WLX in common.

In each string group STRG, respective gates of the respective transistors SDTr of the plurality of strings STR are connected to the drain-side selection gate line SGDL in common. The selection gate lines SGDL0 to SGDLi are respectively provided for the string group STRG0 to the string group STRGi.

In each string group STRG, respective gates of the respective transistors SSTr of the plurality of strings STR are connected to the source-side selection gate line SGSL in common. The source-side selection gate lines SGSL0 to SGSLi are respectively provided for the string group STRG0 to the string group STRGi.

A plurality of cell transistors MTr which are connected to the same one word line WL shared by the plurality of strings STR in one string group STRG constitute a physical unit. A storage space in one physical unit constitutes one or more pages. One page may include a storage space of some cell transistors MTr in the physical unit. Data is read in accordance with a page unit. Writing may be performed in accordance with a page unit or in accordance with a physical unit.

In each memory block MB, the word lines WL having the same number (address, ID) in the different strings STR are connected to each other. That is, for example, in one memory block MB, in all strings, the word lines WL0 are connected to each other, and the word lines WLX are connected to each other.

To get access to the cell transistor MTr, one memory block MB is selected and one string group STRG is selected. Only in the memory block MB specified based on a block address signal for selecting the memory block MB, to the transistors which control the supply of voltages to the word lines WL, the selection gate lines SGSL, SGDL, a voltage which turns on the transistors is supplied. When the transistors are turned on by the supply of voltages, the word lines WL, and the selection gate lines SGSL, SGDL in the selected memory block MB are connected to a driver in the core driver 9.

Further, to select one string group STRG, the selected gate transistors SSTr, SDTr receive voltages for selection only in the selected string group STRG. In the non-selected string group STRG, the selected gate transistors SSTr, SDTr receive a non-selection voltage. The selection voltage depends on an operation such as reading or writing. In the same manner, the non-selection voltage also depends on an operation such as reading or writing.

Figure 3:
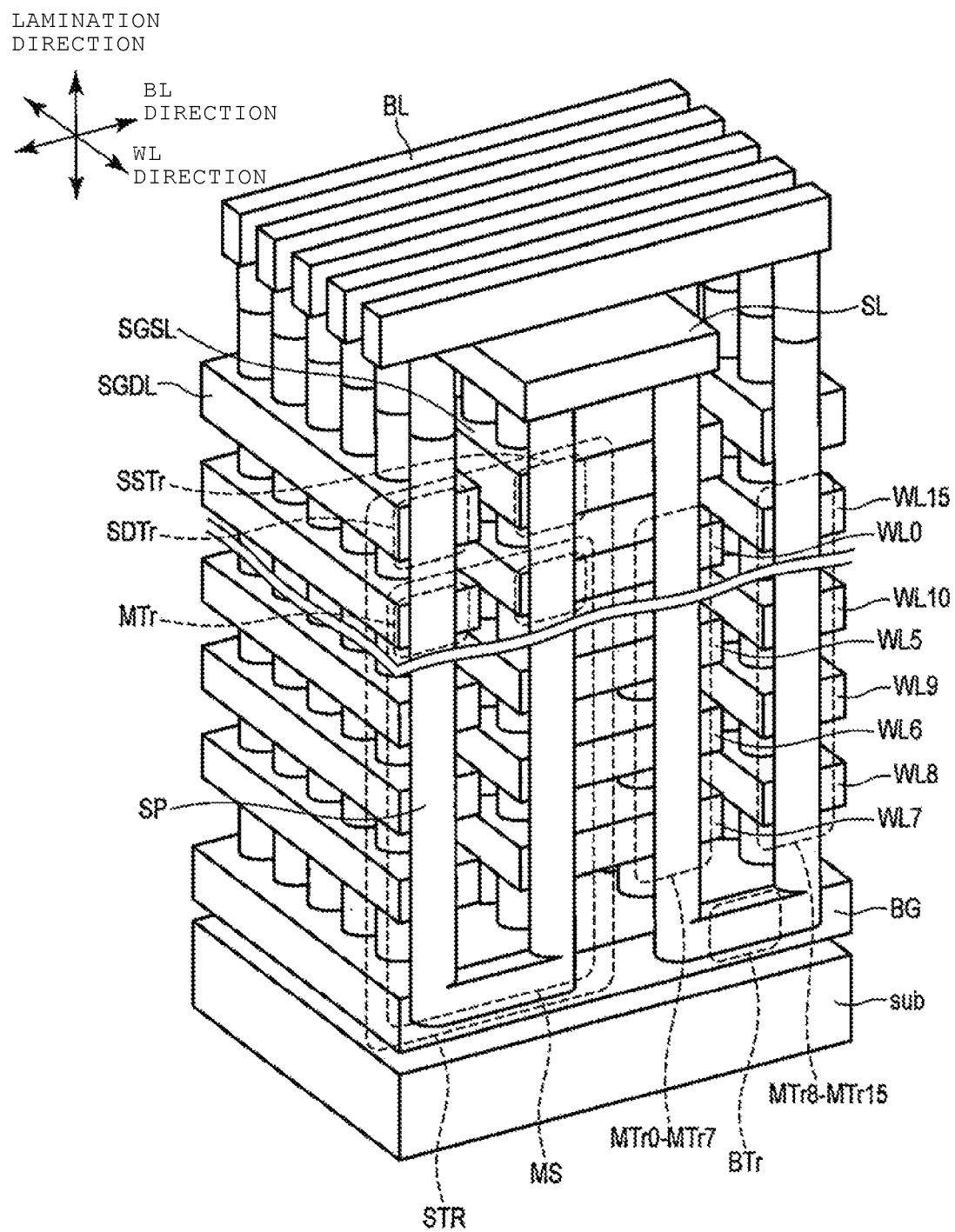
FIG. 3 is a perspective view of a part of the memory cell array according to the first embodiment.

FIG. 3 is a perspective view of a part of the memory cell array according to one embodiment. As shown in FIG. 3, the source line SL extends along the WL direction. The bit lines BL extend in the BL direction. The BL direction is orthogonal to the WL direction.

Each string STR includes the memory string MS, the source-side selection gate transistor SSTr, and the drain-side selection gate transistor SDTr. The memory strings MS are positioned above a substrate sub in the stacking direction. FIG. 3 shows an example where one string STR includes 16 memory cell transistor MTr0 to MTr15. The cell transistors MTr0 to MTr7 are arranged parallel to each other in the direction approaching the substrate along the stacking direction in this order. The cell transistors MTr8 to MTr15 are arranged parallel to each other in the direction away from the substrate along the stacking direction in this order. Each cell transistor MTr includes a semiconductor pillar SP, an insulation film formed on a surface of the semiconductor pillar SP, and the word lines (control gate) WL. The back gate transistor BTr is connected between the cell transistors MTr7, MTr8 arranged at the lowermost position.

The selection gate transistors SSTr, SDTr are respectively positioned above the uppermost cell transistors MTr0, MTr15 in the stacking direction. A drain of the transistor SSTr is connected to a source of the cell transistor MTr0. A source of the transistor SDTr is connected to a drain of the cell transistor MTr15. A source of the transistor SSTr is connected to the source line SL. A drain of the transistor SDTr is connected to the bit line BL.

The plurality of strings arranged parallel to each other along the WL direction constitute the string group. For example, all of the plurality of strings which are arranged parallel to each other along the WL direction and are respectively connected to all bit lines BL constitute the string groups. In each string group, the respective gates of the respective cell transistors MTr0 of the plurality of strings are connected to the word line WL0 in common. In the same manner, in each string group, the respective gates of the respective cell transistors MTrX of the plurality of strings are connected to the word line WLX in common. The word lines WL extend in the WL direction. The gates of the back gate transistors BTr are connected to the back gate line BG in common.

In each string group STRG, the respective gates of the transistors SDTr of the plurality of strings STR are connected to the drain-side selection gate line SGDL in common. In each string group STRG, the respective drains of the transistors SDTr of the plurality of strings STR are connected to the same bit line BL. The selection gate lines SGDL extend in the WL direction. The selection gate lines SGDL0 to SGDLi are respectively provided for the string group STRG0 to the string group STRGi.

In each string group STRG, the respective gates of the transistors SSTr of the plurality of strings STR are connected to the source-side selection gate line SGSL in common. The respective sources of the transistors SSTr of two strings STR which are arranged parallel to each other in the BL direction are connected to the same source line SL. In each string group STRG, the sources of the transistors SSTr of the plurality of strings STR are connected to the same source line SL. The selection gate line SGSL and the source line SL extend in the WL direction. The source-side selection gate lines SGSL0 to SGSLi are respectively provided for the string group STRG0 to the string group STRGi.

Referring to FIG. 2, the word lines WL of the different strings STR having the same address are electrically connected to each other. For example, the word lines WL0 in one memory block MB have end portions thereof connected to each other by an interconnecting part extending in the BL direction. Accordingly, to observe the word lines WL0 along a plane formed of the BL direction and the WL direction, the word lines WL0 have a comb-teeth shape. The word lines WL1 to WL7 also have the same shape as the word lines WL0. In the same manner, the word lines WL8 in one memory block MB have end portions thereof connected to each other by an interconnecting part which extends in the BL direction. Accordingly, the word line WL8 has a comb-teeth shape when observed along a plane formed of the BL direction and the WL direction. The word lines WL8 to WL15 also have the same shape as the word lines WL8. The interconnecting portions of the word lines WL0 to WL7 and the interconnecting portions of the word lines WL8 to WL15 are arranged on sides opposite to each other in a plane formed of the BL direction and the WL direction. In each layer, tooth portions of the word lines WL having different addresses are arranged alternately.

Another configuration example of the memory cell array 1 is described in U.S. patent application Ser. No. 12/407,403 filed on Mar. 19, 2009 (three-dimensionally laminated non-volatile semiconductor memory), for example. Further, the configuration of the memory cell array 1 is described in U.S. patent application Ser. No. 12/406,524 filed on Mar. 18, 2009 (three-dimensionally laminated non-volatile semiconductor memory), U.S. patent application Ser. No. 12/679,991 filed on Mar. 25, 2010 (non-volatile semiconductor storage device and method of manufacturing the same), and U.S. patent application Ser. No. 12/532,030 filed on Mar. 23, 2009 (semiconductor memory and method of manufacturing the same). The entire contents of these patent applications are incorporated herein by reference.

Figure 4:
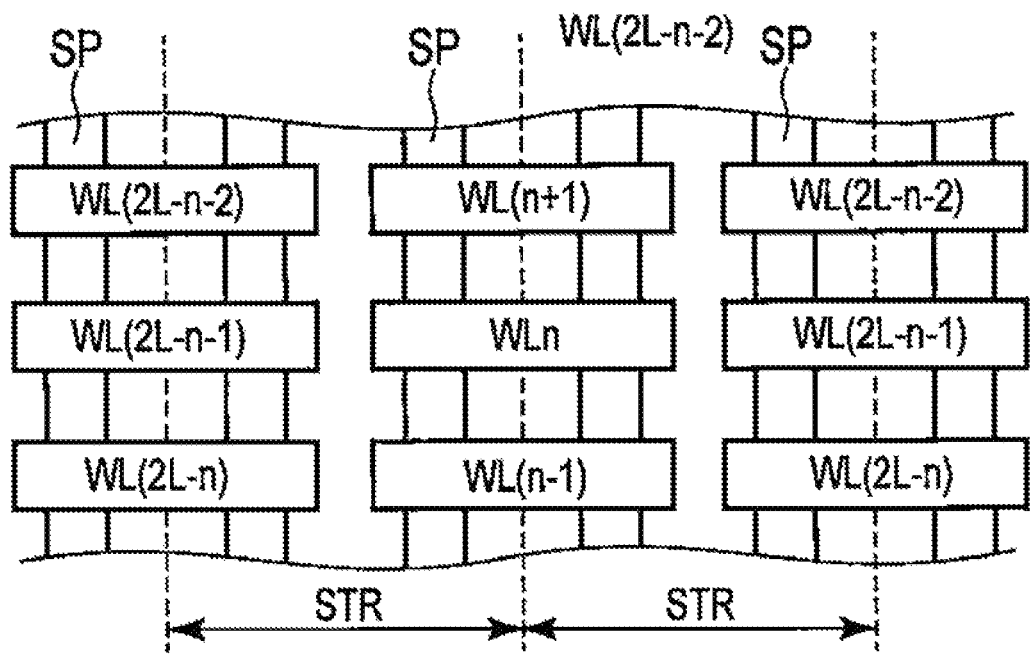
FIG. 4 is a cross section of a part of the memory cell array according to the first embodiment.

FIG. 4 shows an example of a cross section of a part of the memory cell array 1. As shown in FIG. 4, the plurality of word lines WL are arranged in a matrix array. The vertical direction in the drawing corresponds to the direction which intersects with a surface of the semiconductor substrate (not shown). FIG. 4 shows an example where L pieces of word lines WL are arranged parallel to each other in the vertical direction.

Figure 5:
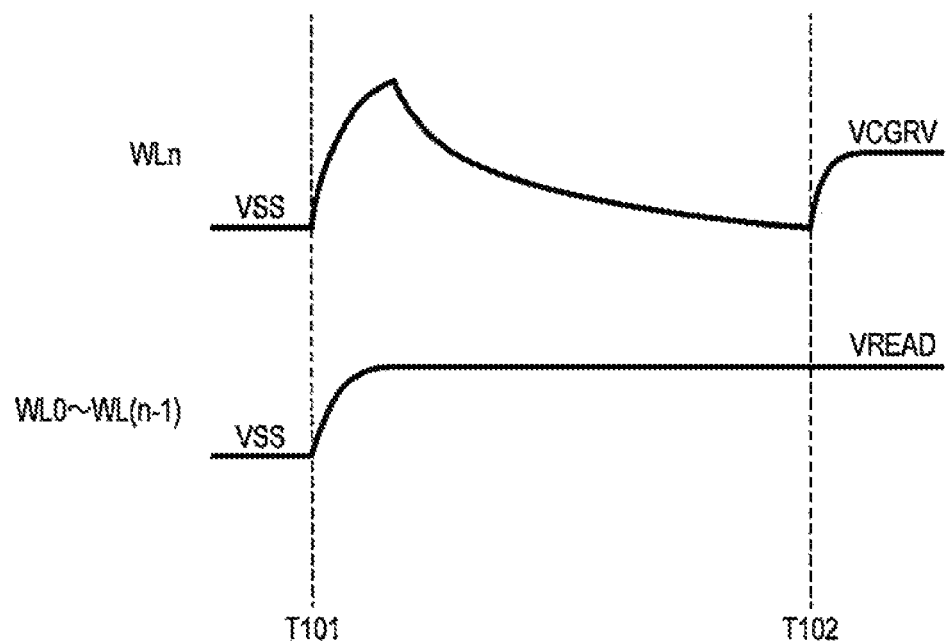
FIG. 5 is a timing chart of potentials of several elements of a semiconductor storage device.

In reading data from the cell transistor MTr including one word line (selected word line) WLn and one semiconductor pillar SP which penetrates the word line WLn, a potential of the selected word line WLn is raised to a reading potential VCGRV as shown in FIG. 5. Prior to the rise of the potential of the selected word line WLn to VCGRV, a potential of all word lines (non-selected word lines) WL other than the selected word line WLn is raised to a potential VREAD from a point of time T101. When the non-selected word line WL is charged, the following phenomenon may occur.

The word lines WL arranged adjacent to each other are coupled to each other by capacitive coupling. As shown in FIG. 5, the capacitive coupling raises the potential of the selected word line WL by charging of the non-selected word lines WL. It is necessary to return the raised potential of the selected word line WLn to a potential VSS prior to the start of charging the selected word lines WLn to the potential VCGRV. A time from the point of time 1101 to a point of time that the potential of the selected word line WLn returns to the potential VSS, that is, the time from the point of time T101 to the point of time T102 is referred to as a setup time in this disclosure. It is preferable that the setup time is short. On the other hand, to enhance the performance of the semiconductor storage device 10, a distance between the word lines WL may be decreased or a thickness of the word line WL may be increased. If this happens, a coupling capacitance of the word line WL is increased. The increase of the coupling capacitance increases the rise of the potential (coupling noises) of the selected word line WL brought about by the rise of the potential of the non-selected word line WL described previously, leading to excessively large rise of the potential (overshoot) beyond expected levels.

The semiconductor storage device 10 according to the first embodiment is configured to operate as described below.

Figure 6:
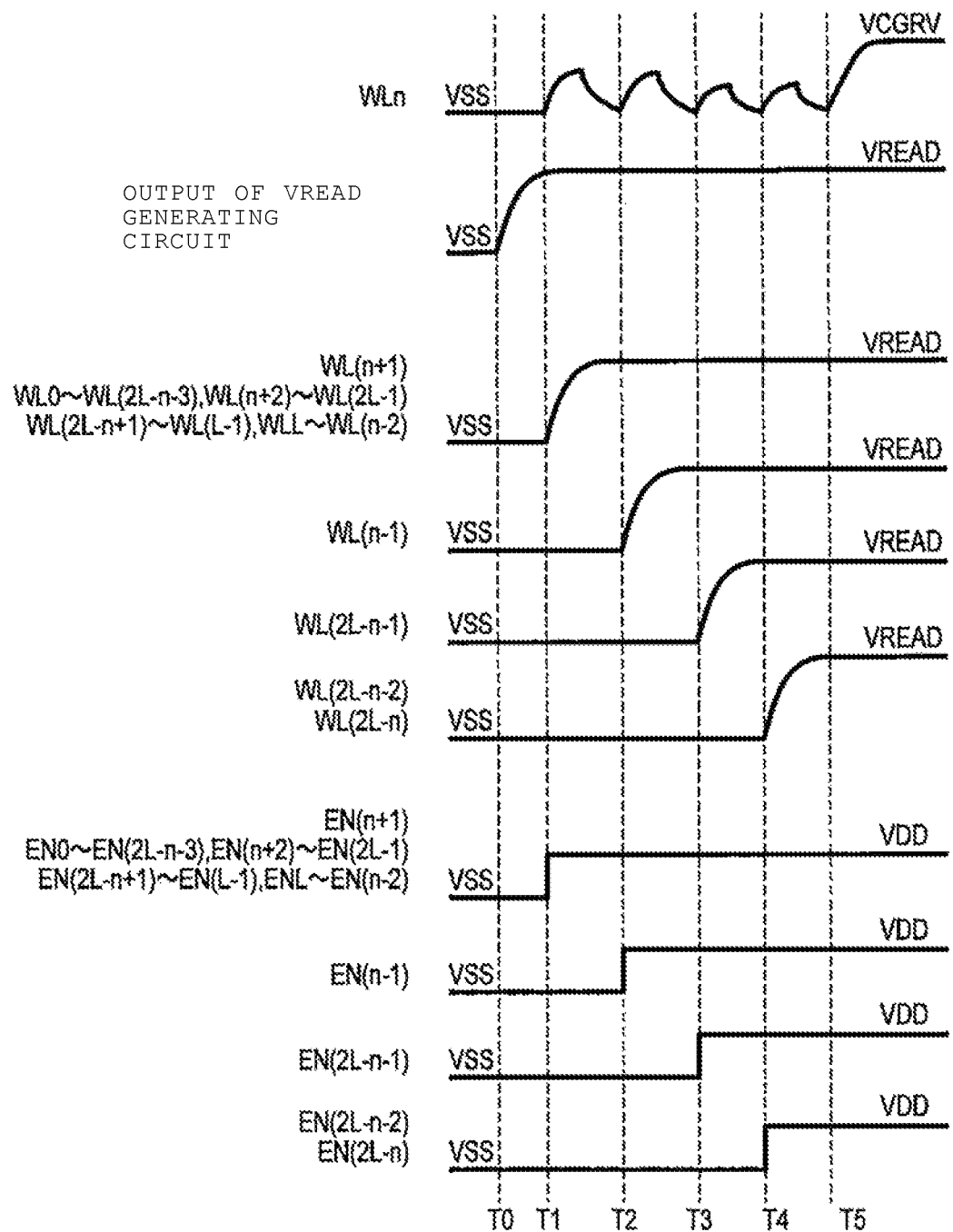
FIG. 6 is a timing chart of potentials of several elements of the semiconductor storage device according to the first embodiment.

FIG. 6 is a timing chart of potentials of several elements of the semiconductor storage device 10 according to the first embodiment. The specific configuration of the semiconductor storage device 10 for performing the operation shown in FIG. 6 is described later.

As shown in FIG. 6, in the same manner as FIG. 4, prior to the rise of the potential of the selected word line WLn from a potential VSS to a potential VCGRV, potentials of all non-selected word lines WL are raised to a potential VREAD from the potential VSS. The potential of the word lines WL is fixed to the potential VSS during operations other than operations such as reading and writing. The potential VCGRV is applied to the selected word line WLn for reading data from one or a plurality of cell transistors (selected cell transistors) MTr which include the selected word line WLn as a part thereof. When the semiconductor storage device 10 holds data of 1 bit in one cell transistor MTr, the potential VCGRV is set to one level. The semiconductor storage device 10 applies the potential VCGRV of a preset level to the selected word lines WLn. On the other hand, when the semiconductor storage device 10 holds data of 2 bit or more in one cell transistor MTr, the semiconductor storage device 10 applies the potential VCGRV of one of a plurality of levels corresponding to data held by the cell transistor MTr to the selected word line WLn. On the other hand, the potential VREAD has magnitude which turns on the cell transistor (non-selected cell transistor)

MTr including the non-selected word line WLn without regard to the data held by the non-selected cell transistor MTr.

The semiconductor storage device 10 charges, from a point of time T1, one of two word lines WL (n−1), WL (n+1) which are arranged adjacent above and below the selected word line WLn to a potential VREAD. FIG. 6 and the description made hereinafter are made with respect to an example where the word line WL (n+1) is selected. Next, the semiconductor storage device 10 charges, from a point of time T2, the other of two word lines WL (n−1), WL (n+1) which are arranged adjacent above and below the selected word line WLn. In the example of FIG. 6, the semiconductor storage device 10 charges the word line WL (n−1) to a potential VREAD.

The semiconductor storage device 10 also charges, from the point of time T1 or T2, the non-selected word lines WL0 to WL (2L-n−3), WL (n+2) to WL (2L-1) arranged above the word line WL (n+1), and the non-selected word lines WL (2L-n+1) to WL (L-1), WLL to WL (n−2) arranged below the word line WL (n−1) to the potential VREAD. The non-selected word lines WL0 to WL (2L-n−3), WL (n+2) to WL (2L-1), WL (2L-n+1) to WL (L-1), WLL to WL (n−2) may be respectively charged from the point of time T1 or may be charged from the point of time T2. FIG. 6 shows an example where all of the non-selected word lines WL0 to WL (2L-n−3), WL (n+2) to WL (2L-1), WL (2L-n+1) to WL (L-1), WLL to WL (n−2) are charged from the point of time T1.

The semiconductor storage device 10 charges, from a point of time T3, the word lines WL (2L-n−1) arranged adjacent to left and right sides of the selected word line WLn to a potential VREAD. Next, the semiconductor storage device 10 charges, from a point of time T4, remaining non-selected word lines arranged adjacent to the selected word lines WLn, that is, the word line WL (2L-n) and WL (2L-n−2) arranged diagonally adjacent to the selected word line WLn to a potential VREAD.

In this manner, in the first embodiment, charging of the non-selected word lines WL to the potential VREAD is started at timings different for every one or a plurality of non-selected word lines WL. The order of the start of charging is not limited to the example shown in FIG. 6 and may be determined differently. Further, the set of word lines WL whose charging is started at the same timing is not limited to the example shown in FIG. 6. The charging is started at least at timings where the rise of a potential to the potential VREAD differs among the different non-selected word lines WL. However, it is preferable that the charging of at least the non-selected word lines WL (n−1), WL (n+1) arranged adjacent above and below the selected word line WLn is started at different timings. Among all non-selected word lines WL, the influence exerted on the selected word line WLn from the word lines WL (n−1), WL (n+1) is the largest and hence, when these are charged simultaneously, the influence exerted on the selected word line WLn becomes large. The combination of the non-selected word lines WL whose charging is started simultaneously is described in detail later.

By dispersing the timings of the start of charging the non-selected word lines WL over the point of times T1 to T4, it is achieve the rise of the potential of the selected word lines WLn as a result of the coupling, as shown in FIG. 6. Firstly, from the point of time T1, as a result of the rise of the potential of the adjacent word line WL (n+1), the potential of the selected word line WLn is raised. However, from the point of time T1, a smaller number of the non-selected word lines WL than in the example shown in FIG. 4, are charged. Accordingly, the rise of the potential of the selected word line WL from the point of time T1 is smaller than the rise of the potential from the point of time T101 shown in FIG. 4 and hence, the potential of the selected word line WLn is more easily lowered to the potential VSS.

In the same manner, from the point of time T2, as a result of the rise of the potential of the adjacent word line WL (n−1), the potential of the selected word line WLn is raised. However, in the same manner, the rise of the potential of the selected word line WLn from the point of time T2 is smaller and hence, the potential of the selected word line WLn is more easily lowered to the potential VSS. The influence exerted on the selected word line WLn by the rise of the potential of the non-selected word lines WL0 to WL (2L-n−3), WL (2L-n+1) to WL (n−2), WL (n+2) to WL (2L-1) is far smaller than the influence exerted on the selected word line WLn by the rise of the potential of the adjacent word lines WL. Accordingly, in FIG. 6, the rise of the potential of the selected word line WLn from the point of time T1 and the rise of the potential of the selected word line WLn from the point of time T2 are approximately the same.

From the point of time T3, as a result of the rise of the potential of the adjacent word lines WL (2L-n−1), the potential of the selected word line WLn is raised. However, in the same manner, the rise of the potential of the selected word line WLn from the point of time T3 is smaller and hence, the potential of the selected word line WLn is more easily lowered to the potential VSS.

From the point of time T4, as a result of the rise of the potential of the adjacent word lines WL (2L-n−2), WL (2L-n), the potential of the selected word lines WLn is raised. However, in the same manner, the rise of the potential of the selected word line WLn from the point of time T4 is smaller and hence, the potential of the selected word line WLn is more easily lowered to the potential VSS. Thereafter, from a point of time T5, the selected word line WLn is charged to the potential VCGRV. Other signals shown in FIG. 6 are described later.

As has been explained above, timings at which the selected word line WLn is influenced by the adjacent word lines WL are dispersed and hence, a peak of the rise of the potential of the selected word line WLn is made to become smaller than a peak shown in FIG. 5. That is, by dispersing the timings of the start of the rise of the potentials of the plurality of non-selected word lines WL to the potential VREAD, the magnitude of the rise of the potential of the selected word line WLn as a result of the coupling may be controlled. By properly selecting the set of the non-selected word lines WL (non-selected word lines set) whose potentials are raised (e.g., selecting the timing when the charging is started) simultaneously, an overshoot of the potential of the selected word line WLn may be avoided. The overshoot may extend a setup time so that the setup time exceeds the predetermined time or the overshoot may induce disturbance to the selected word line WL that is beyond expected levels. These phenomena bring about erroneous reading. To the contrary, by obviating such an overshoot, it is possible to prevent the setup time from exceeding a predetermined time unintentionally.

It is possible to determine the non-selected word line set based on matters studied below. Firstly, as described previously, it is desirable that charging of at least one pair of non-selected word lines WL arranged adjacent above and below the selected word line WLn is started at different timings. It is because, among all non-selected word lines WL, the selected word line WLn is influenced the most by the word lines WL (n−1), WL (n+1). That is, facing areas of the word lines WL arranged above and below the selected word line WL are larger than facing areas of the word lines of other sets which face each other.

It is considered that the influence of the word lines WL (2L-n-2), WL (2L-n) arranged diagonally adjacent to the selected word line WLn exerted on the word line WLn is small. Accordingly, it is likely that, even when the charging of these word lines is started at the same timing, an amount of the rise of the potential of the selected word line WLn by these word lines is smaller than the influence exerted independently by the word line WL (n-1) or the word line WL (n+1) arranged above and below the selected word line WLn. Accordingly, charging of the word lines WL (2L-n-2), WL (2L-n) is started at the same timing (forming the non-selected word line set). In the same manner, it is considered that the influence of the word lines WL (2L-n-1) arranged adjacent to left and right sides of the selected word line WLn exerted on the word line WLn is also small. It is because the word line WLn and the adjacent word line WL (2L-n-1) face each other with a small area. However, even when the influence exerted by one adjacent word line WL is small, there are four diagonally adjacent word lines WL and hence, a total of influence can be large. In such a case, the set of the diagonally adjacent word lines WL is divided into two or more sub-sets, and charging is started at different timings for the respective sub-sets. In the same manner, it is considered that the influence of the word lines WL (2L-n-1) arranged to left and right sides of the selected word line WL exerted on the word lines WLn is also small. In view of the above, a non-selected word line set may be formed by one or a plurality of left and right adjacent word lines WL and one or a plurality of diagonally adjacent word lines WL. Further, when the influence of the vertically adjacent word lines WL or the diagonally adjacent word lines WL exerted on the word line WLn is small, a non-selected word line set may be formed of one or a plurality of vertically or diagonally adjacent word line WL and one vertically adjacent word line WL. By properly forming the non-selected word line set, an amount of the rise of the potential of the selected word line WLn by the non-selected word lines WL may be controlled. By suppressing the amount of the rise of the potential, an amount of disturbance brought about by the rise of the potential may be lowered.

Further, there may be a case where a conductor which extends vertically is provided between left and right adjacent word lines WL in FIG. 3, for example. In such an example, the selected word line WLn is capacitively coupled to only the vertically adjacent word lines WL. Accordingly, it is unnecessary to take into account the rise of a potential of selected word line WLn by the rise of potentials of the left and right adjacent non-selected word lines WL.

Further, when the structure of a memory cell array of a type described in the specification of U.S. patent application Ser. No. 12/407,403 is adopted by the memory cell array 1, the selected word line WLn is capacitively coupled to only the vertically adjacent word lines WL. Accordingly, it is also unnecessary in such an example to take into account the rise of a potential of the selected word line WLn by the rise of potentials of left and right adjacent non-selected word lines WL.

Figure 7:
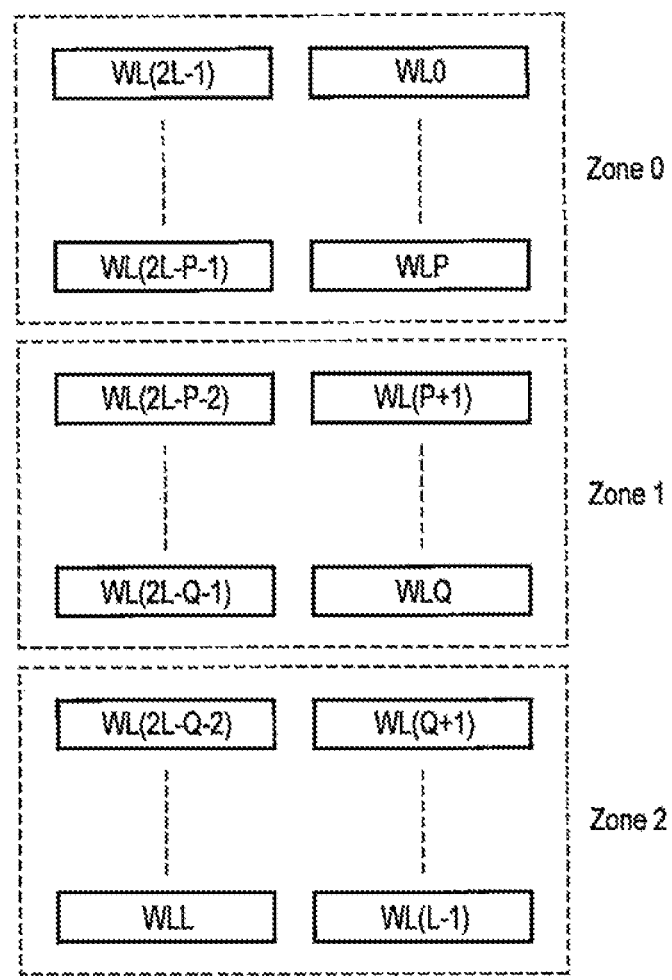
FIG. 7 illustrates zones of word lines according to the first embodiment.

Further, timings at which charging of the word lines of the non-selected word line set is simultaneously started and (or) the timings at which charging of the word lines of the non-selected word line set is simultaneously started may be determined based on the level of the word lines WL. For example, as shown in FIG. 7, in each string, the word lines WL in plural layers are divided into a plurality of independent zones. Each zone may include one word line WL or a plurality of continuously arranged word lines WL.

As a specific example, in one zone, the non-selected word lines WL are divided into a small number of sub-sets and, in another zone, the non-selected word lines WL are divided into a large number of sub-sets. To be more specific, in the first zone, the first sub-set includes two vertically adjacent word lines WL, the second sub-set includes two left and right adjacent word lines WL, and the third sub-set includes four diagonally adjacent word lines WL. In the second zone, the first and second sub-sets include one or the other of two vertically adjacent word lines WL respectively, and the third and fourth sub-sets include one or the other of two left and right adjacent word lines WL respectively, and the fifth sub-set includes four diagonally adjacent word lines. The remaining word lines WL, which are not referred to in the examples (for example, the word lines WL arranged further above or below the vertically adjacent word lines WL), exert a small influence on the selected word line WLn and hence, the word lines WL may be included in the arbitrary sub-set as described above.

For example, the first zone (the zone including the sub-set having a small number of non-selected word lines WL) is the upper zone, and is zone 0 in FIG. 7, for example. The second zone (the zone including the sub-set having a large number of non-selected word lines WL) is a lower zone, and is zone 2 in FIG. 7, for example. The semiconductor pillar SP is formed with a conduction material that fills up a memory hole which penetrates the word line WL and the interlayer insulation film. Under the current technology, a diameter of the memory hole becomes irregular according to a depth of the memory hole and hence, a diameter of the semiconductor pillar SP also becomes irregular. Because of the irregularity in the diameter of the semiconductor pillar SP, a size of a plane where the word line WL and the semiconductor pillar SP face each other also becomes irregular according to the depth. That is, the characteristic of the word line WL becomes irregular based on the level of the position of the word line WL. Particularly, when a capacitance between the word lines WL is dominant, the smaller the diameter of the semiconductor pillar SP is, the smaller a capacitance between the word line WL and a channel in the semiconductor pillar SP becomes and hence, it takes a long time for charging or discharging the word line WL. In addition, the smaller the diameter of the semiconductor pillar SP is, the larger a coupling capacitance between the word lines becomes and hence, the influence exerted by the above-mentioned coupling capacitance also becomes irregular according to the irregularity in diameter of the semiconductor pillar SP. To be more specific, when the non-selected word line set which is equal to the non-selected word line set used in the zone where the word line coupling is smaller (for example, the uppermost zone) is used in the zone where the word line coupling is larger (for example, the lowermost zone), there may be a case where an amount of the rise of a potential of the selected word line WLn as a result of coupling becomes non-uniform. In view of the above, in the zone where the word line coupling is larger as described above (for example, zone 0), the non-selected word line set is formed with a smaller number of word lines WL, e.g., as in the first zone. At the same time (or alternatively), the word line WL having a large capacitive coupling with the selected word line WLn by itself constitutes the non-selected word line set. As a result, in the zone having a larger word line coupling, although a setup time may be longer than a setup time in the zone where the word line coupling is small, it is possible to make the influence from disturbance between the zones uniform while avoiding an overshoot of a potential of the selected word line WLn. The number of zones may be 2 or 4 or more. Each zone may include only the word line WL of one layer.

Figure 8:
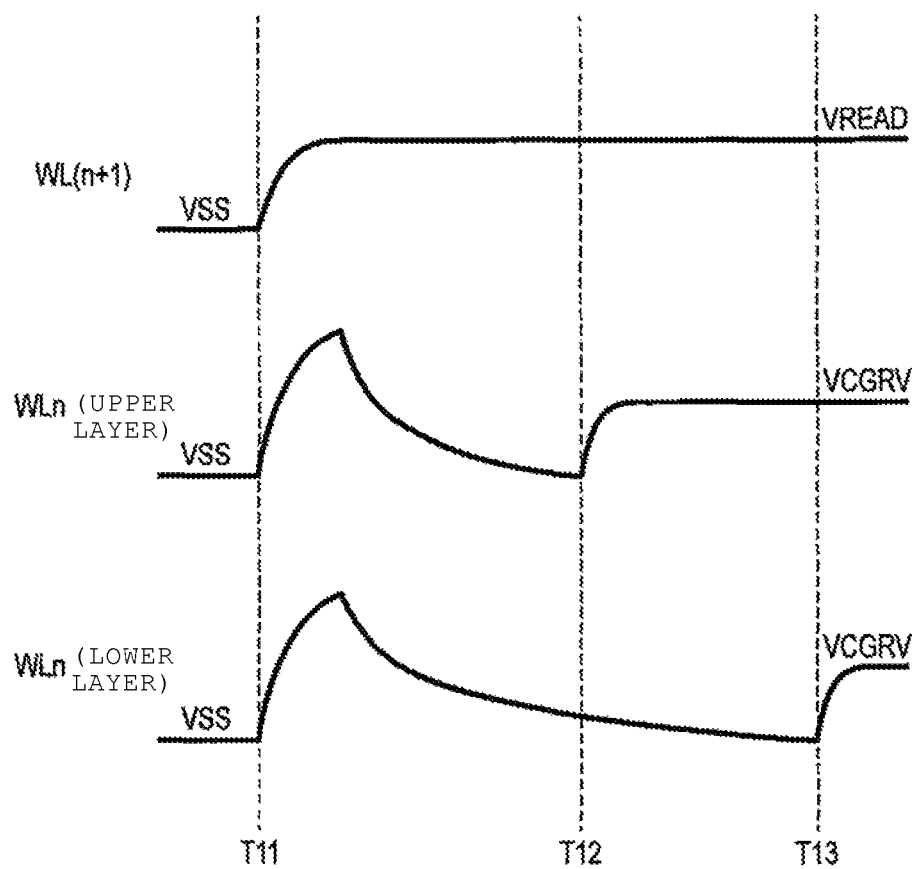
FIG. 8 is a timing chart showing a variation of timings of applying potentials in the first embodiment.

In an alternative embodiment, when the members of the non-selected word lines are divided into a plurality of zones, the rise of a potential is started at different timings in different zones. The larger the word line coupling in the zone is, the longer a time necessary for discharging the selected word line WLn becomes. In view of the above, as shown in FIG. 8, in the zone where the word line coupling is larger (for example, the lower layer), an interval of timing at which charging to a potential VCGRV is started is set longer than an interval of timing of such charging in the zone where the word line coupling is smaller. To explain this configuration more specifically with reference to FIG. 7, in the upper zone (for example, zone 0), an interval between the point of time T11 and the point of time T12, and an interval between a point of time T12 and a point of time T13 become shorter, while in the lower zone (for example, zone 2), the interval between the point of time T11 and the point of time T12 and the interval between the point of time T12 and the point of time T13 become longer. As a result, in the zone where the word line coupling is larger, it is possible to suppress erroneous reading of data which may occur as a result of insufficient discharging of the selected word line WLn.

In each string, the lowermost or uppermost word line WL may form one zone. That is, per one string, the uppermost zone includes only the uppermost word line WL, and the lowermost zone includes only the lowermost word line WL. This is because the lowermost or the uppermost word line WL is provided with the adjacent word line WL only above or below the word line WL in the vertical direction.

Figure 9:
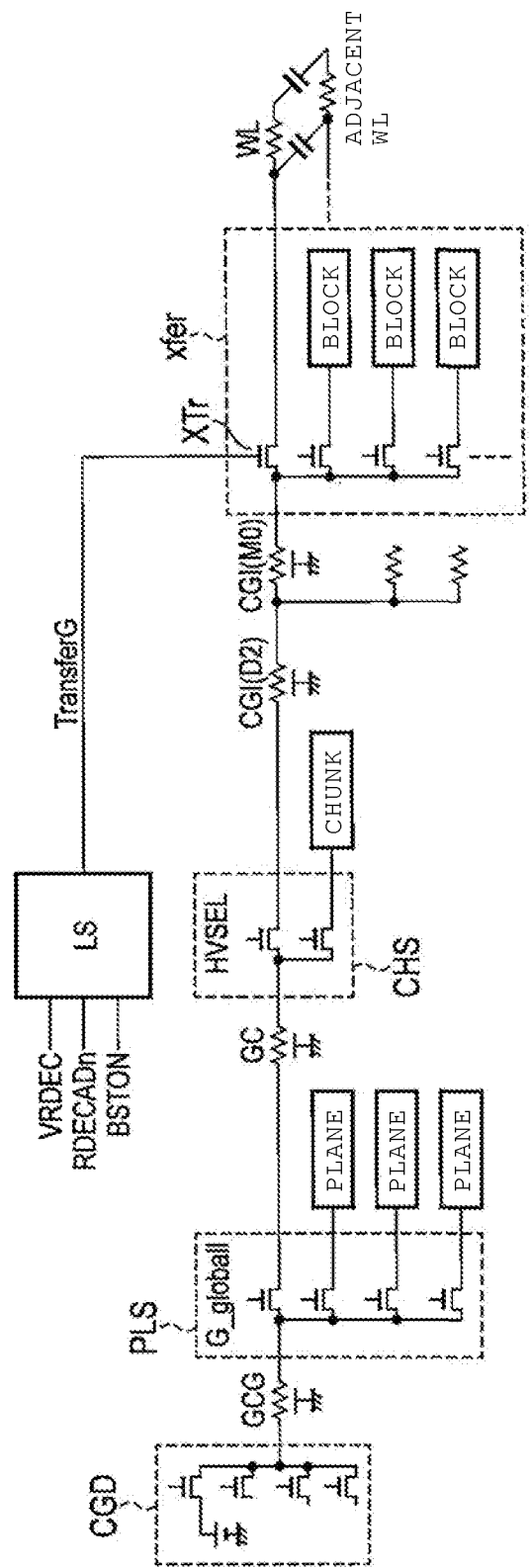
FIG. 9 is a block diagram showing a circuit of a part of the semiconductor storage device according to the first embodiment.
Figure 10:
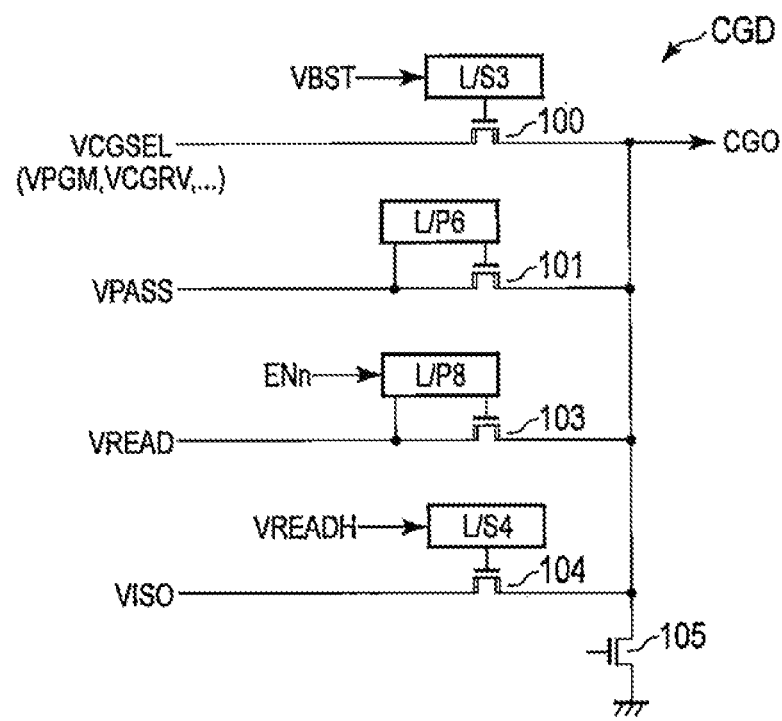
FIG. 10 is a block diagram showing a part of the semiconductor storage device according to the first embodiment.
Figure 11:
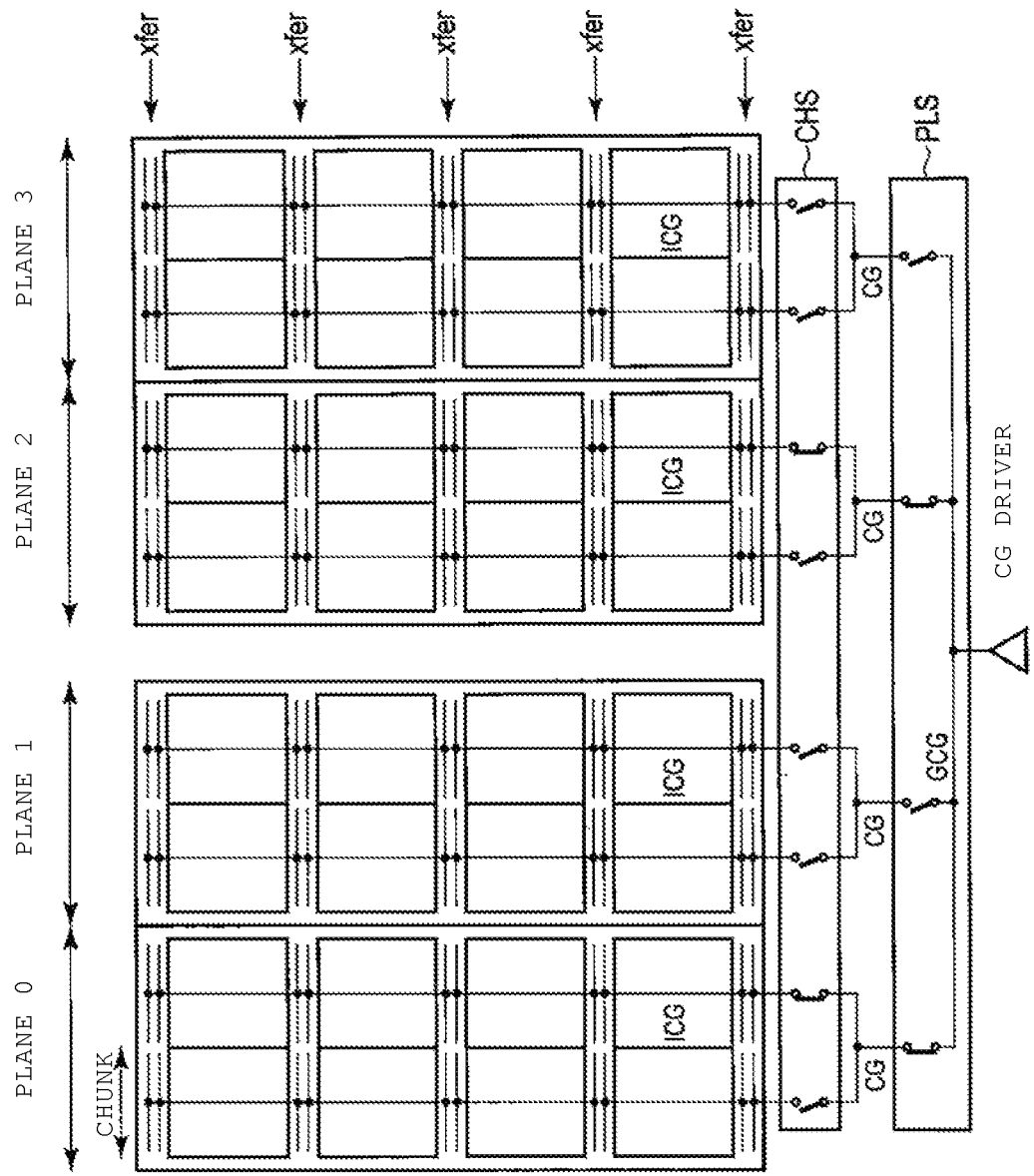
FIG. 11 is a block diagram showing a part of the semiconductor storage device according to the first embodiment.
Figure 12:
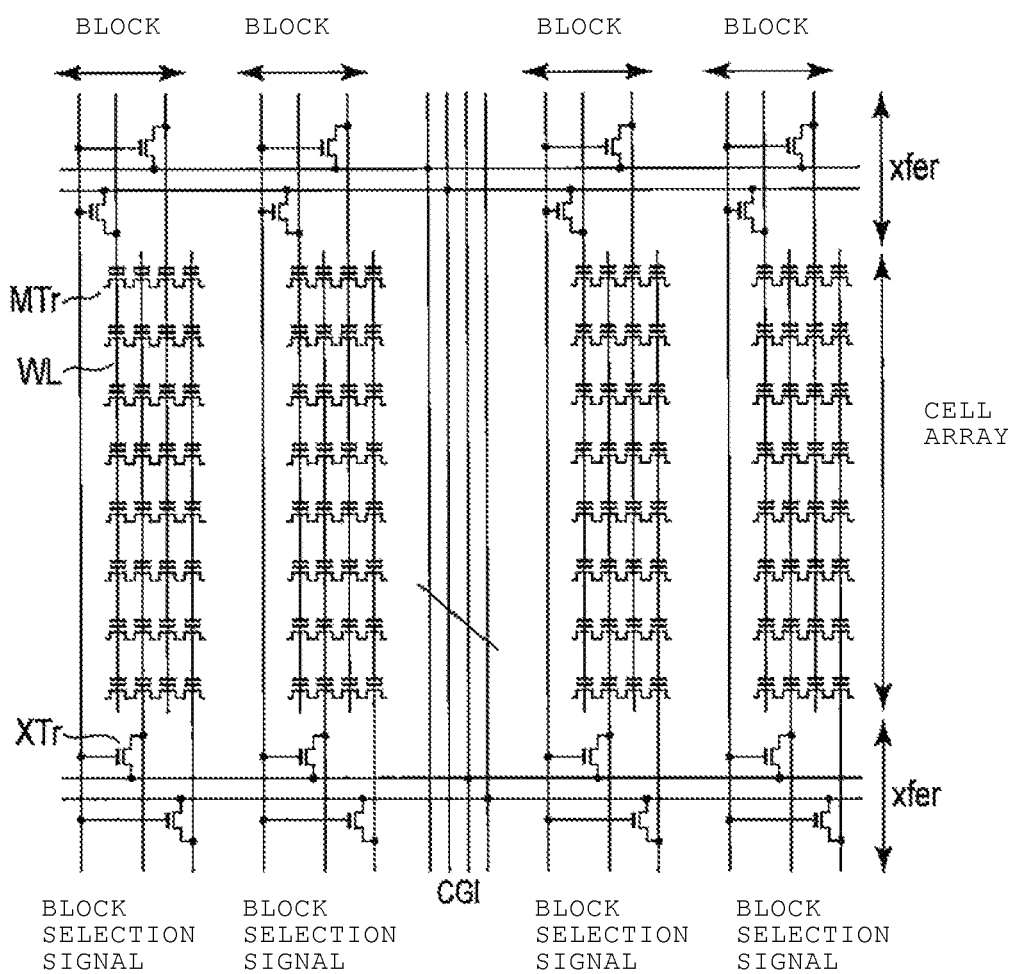
FIG. 12 is a block diagram showing a part of the semiconductor storage device according to the first embodiment.

Next, one example of the configuration for controlling the start timing of the charging of the word lines WL is described. CG lines CG0 to CG (2L-1) are provided for the word lines WL0 to WL (2L-1), respectively. The word lines WL0 to WL (2L-1) are selectively connected to the CG lines CG0 to CG (2L-1) respectively so as to receive potentials from the connected CG lines. The rise timings of potentials of the respective word lines WL are controlled through a control of a timing of the rise of potentials of the corresponding CG lines. FIG. 9 shows a circuit of a part of the semiconductor storage device according to the first embodiment, and shows the elements and the connections with respect to the CG line (for example CGn) having one address (ID) associated with the word line WL (for example WLn) having one address (ID) are shown as a representative for the corresponding CG line. That is, the set of elements and connections substantially equal to the set of elements and connections shown in FIG. 9 are provided for each CG line. FIG. 10 to FIG. 12 also show parts of the semiconductor storage device according to the first embodiment, and describe parts associated with FIG. 9 in more detail.

As shown in FIG. 9, one CG driver CGD is provided for one CG line. That is, CG drivers CGD0 to CGD (2L-1) are respectively provided for the CG lines CG0 to CGD (2L-1). The CG driver CGD is included in the core driver 9 shown in FIG. 1, for example, and the CG driver CGD is configured to output one potential selected from a plurality of potentials at the selected timing. To this end, the CG driver CGD includes elements and connections shown in FIG. 10, for example. The CG driver CGD receives potentials of various magnitudes, for example, a potential VCGSEL, a potential VPASS, a potential VREAD, a potential VISO and the like from the voltage generating circuit 8 shown in FIG. 1. The voltage generating circuit 8 includes circuits for generating the respective potentials (not shown). The respective potentials are supplied to an output CG0 through transistors 100, 101, 103, 104. A potential VCGSEL is a collective term for potentials applied to the selected word lines WLn at the time of reading or writing data, and includes a write (program) potential VPGM, a potential VCGRV and the like. The potentials VPASS, VISO are applied to the non-selected word line WL at the time of writing data.

The transistors 100, 101, 103, 104 receive an output of a level shifter L/S3, outputs of local pumps L/P6, L/P8, and an output of a level shifter L/S4 at gates thereof, respectively. The level shifters L/S3, L/S4, and the local pumps L/P6, L/P8 are turned on when these parts receive enable signals from the control circuit 5 shown in FIG. 1. In FIG. 10, only the enable signal EN (ENn) of the local pump L/P8 relating to a control of a potential VREAD is shown. The control circuit 5 outputs enable signals for the respective CG drivers CGD at timings where potentials of the respective word lines WL rise at the above-mentioned timings. Particularly, at the time of reading according to the first embodiment, the control part 5 outputs the enable signals EN0 to EN (2L-1) to the CG drivers CGD0 to CGD (2L-1) respectively. During a period where the semiconductor storage device 10 is in a standby state, the CG driver CGD fixes an output CG0 to VSS by the transistor 105. Then, the CG driver CGD, along with starting of an operation such as reading or writing, releases fixing of the output to the potential VSS and, at the same time, outputs a specified potential.

As described above, the control circuit 5 rises the potentials of the different non-selected word lines WL at the different timings based on addresses of the selected word lines WLn. To this end, the control circuit 5 outputs enable signals EN0 to EN (2L-1) based on timings at which the potentials of the non-selected word lines WL are raised. According to the example shown in FIG. 6, the control circuit 5 sets enable signals EN (n+1), EN0 to EN (2L-n-3), EN (n+2) to EN (2L-1), EN (2L-n+1) to EN (L-1), ENL to EN (n-2) at a high level at the point of time T1, and sets an enable signal EN (N-1) at a high level at the point of time T2. Then, the control circuit 5 sets an enable signal EN (2L-n-1) at high level at the point of time T3, and sets enable signals EN (2L-n-2), EN (2L-n) at a high level at the point of time T4. Further, at a point of time T0 preceding the point of time T1, a generation circuit of a potential VREAD is enabled so that the generation circuit starts outputting the potential VREAD.

After a setup time elapses, at the point of time T5, the control circuit 5 enables the CG driver CGDn of the CG line CGn for the selected word line WLn thus making the CG driver output the potential VCGRV.

Returning to FIG. 9, an output of the CG driver CGD is, as shown in FIG. 9 and FIG. 11, connected to corresponding global CG line GCG (GCGn). A resistance and a capacitance shown in association with the global CG line GCG represents a parasitic resistance and a parasitic capacitance. The global CG line GCG having one certain address (ID) is branched to portions for a plurality of (four being exemplified in FIG. 11) planes. That is, the same CG line is provided for the respective planes, the semiconductor storage device 10 includes a plane selector (switch) PLS, and the global CG line GCG is connected to one or a plurality of CG lines selected by the plane selector PLS. The plane selector PLS receives a signal G_global I from the control circuit 5, for example, and connects the global CG line GCG to the CG line on one or a plurality of planes specified by the signal G_global I. A resistance and a capacitance shown in association with the CG line represents a parasitic resistance and a parasitic capacitance.

In each plane, the CG line having one certain address is further branched to portions for a plurality of respective chunks. That is, each plane includes a plurality of (two being exemplified in FIG. 11) chunks. The CG line ICG is provided for each chunk. The semiconductor storage device 10 includes a chunk selector (switch) CHS, and the CG line CG on each plane is connected to one or a plurality of CG lines ICG selected by the chunk selector CHS. A resistance and a capacitance shown in association with the CG line ICG represent a parasitic resistance and a parasitic capacitance.

As shown in FIG. 9 and FIG. 12, in each chunk, the CG line ICG having one certain address is branched into portions for a plurality of respective blocks MB. That is, each chunk includes a plurality of (for example, 474) memory blocks MB, the semiconductor storage device 10 includes a transfer gate xfer, and one CG line ICG is connected to the word lines WL corresponding to one or a plurality of memory blocks MB selected by the transfer gate xfer. The transfer gate xfer is included in the row decoder 2, for example, shown in FIG. 1. The transfer gate xfer includes a plurality of transfer gate transistors XTr, and each transfer gate transistors XTr is turned on upon reception of a signal from the level shifter LS corresponding to each transfer gate transistor XTr. The level shifter LS receives various control signals from the address and command register 7 and the core driver 9, and when selected based on the received control signal, the corresponding transfer gate transistor is turned on.

By the above-mentioned network of the CG lines, the plurality of respective CG lines having different addresses may be connected to the word lines WL corresponding to one or a plurality of selected planes, one or a plurality of selected chunks or one or a plurality of selected memory blocks.

As has been explained heretofore, according to the first embodiment, the potentials of the different non-selected word lines WL may be raised to a potential VREAD at different timings. By such setting of potential rising timing, timings at which the selected word line WLn is influenced by the adjacent non-selected word lines WL may be dispersed. Through the appropriate combination of the non-selected word lines WL (non-selected word line set) which simultaneously raises the potentials thereof, an overshoot of the potential of the selected word line WLn may be avoided. By avoiding the overshoot of the potential of the selected word line WLn, it is possible to avoid a setup time that unintentionally exceeds a predetermined value. Further, through the appropriate selection of the non-selected word line in a set, amounts of rise of a plurality of potentials of the selected word lines WLn may be made uniform. As a result, the disturbance may be made uniform.

Further, by making use of the dispersion of timings at which charging of the non-selected word lines WL is started, timings at which the charging of the non-selected word lines in a set and(or) the non-selected word lines, are simultaneously started may be determined based on the level of the position of the word line WL. Then, for every word line WL having one or a plurality of addresses, timings at which the charging of the non-selected word line in the set and (or) the non-selected word lines are simultaneously started may be optimized. By appropriately adjusting such optimization, the disturbance and (or) the irregularity in a setup time among the word lines WL having different levels may be suppressed.

Second Embodiment

A second embodiment relates to a modification of the first embodiment, and more particularly relates to a control of the potentials of non-selected word lines WL.

Figure 13:
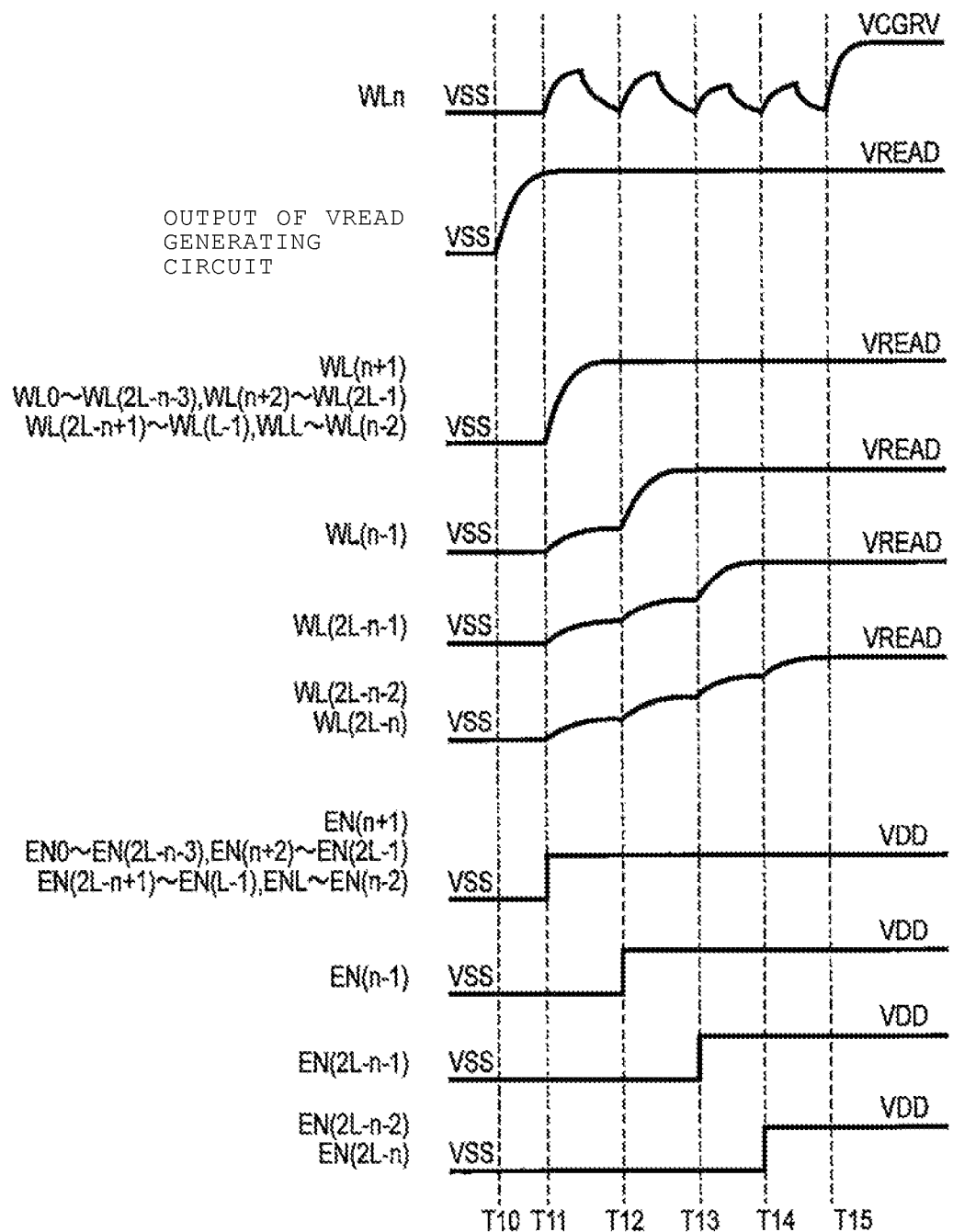
FIG. 13 is a timing chart of potentials of several elements of a semiconductor storage device according to a second embodiment.

FIG. 13 is a timing chart of potentials of several elements of a semiconductor storage device 10 according to the second embodiment. As shown in FIG. 13, a control circuit 5 raises potentials of the different non-selected word lines WL to a potential VREAD at different timings. The combination of the non-selected word lines in a set may be arbitrarily selected in the same manner as the first embodiment. The timing chart in FIG. 13 is prepared in the same manner as the timing chart shown in FIG. 6. That is, the control circuit 5 raises, from a point of time T11, potentials of word lines WL (n+1), word lines WL0 to WL (2L-n-3), word lines WL (n+2) to WL (2L-1), word lines WL (2L-n+1) to WL (L-1), word lines WLL to WL (2L-1) to a potential VREAD. The control circuit 5 raises the potential of a word line WL (n-1) to a potential VREAD from a point of time T12. The control circuit 5 raises the potential of a word line WL (2L-n-1) to a potential VREAD from a point of time T13, and charges the potentials of word lines WL (2L-n-2), WL (2L-n) to a potential VREAD from a point of time T14.

On the other hand, in the second embodiment, the control circuit 5 does not fix the potential of the non-selected word lines WL to the potential VSS and instead places the non-selected word lines WL into a floating state until the rise of the potential to the potential VREAD is started. That is, along with the starting of reading in the semiconductor storage device 10, the control circuit 5 places the non-selected word lines WL into a floating state and, thereafter, raises the potentials of the non-selected word lines WL to a potential VREAD at timings which correspond to the non-selected word lines WL respectively. To be more specific, according to the example shown in FIG. 13, at the point of time T11, the control circuit 5 releases the fixing of the potentials of the word lines WL (n+1), the word lines WL0 to WL (2L-n-3), WL (n+2) to WL (2L-1), the word lines WL (2L-n+1) to WL (L-1), and word lines WLL to WL (2L-1) to a potential VSS, and raises the potentials of the word lines to a potential VREAD. On the other hand, at the point of time T11, the control circuit 5 releases the fixing of the potentials of the non-selected word lines WL (n-1), the word lines WL (2L-n-1), the word lines WL (2L-n-2), and the word lines WL (2L-n) to which the charging to the potential VREAD from the point of time T11 is not started, and places the word lines into a floating state. The potentials of the word lines WL (n-1), the word lines WL (2L-n-1), the word lines WL (2L-n-2), the word lines WL (2L-n) in a floating state are raised by coupling thereof with other word lines WL with which charging is already started.

Next, at the point of time T12, the control circuit 5 releases the fixing of the potential of the word line WL (n-1) to a potential VSS and, at the same time, raises the potential of the word line WL (n-1) to a potential VREAD. On the other hand, the control circuit 5 maintains the word lines WL (2L-n-1), the word lines WL (2L-n-2), the word lines WL (2L-n) in a floating state. The potentials of the word lines WL (2L-n-1), the word lines WL (2L-n-2), the word lines WL (2L-n) in a floating state are raised by the coupling thereof with other word lines WL to which charging is already started. At the point of time T13, the control circuit 5 releases the fixing of the potential of the word line WL (2L-n-1) to a potential VSS and, at the same time, raises the potential of the word line WL (2L-n-1) to a potential VREAD. On the other hand, the control circuit 5 maintains the word lines WL (2L-n-2), WL (2L-n) in a floating state. The potentials of the word lines WL (2L-n-2), the word lines WL (2L-n) in a floating state are raised by the coupling thereof with other word lines WL to which charging is already started. At the point of time T14, the control circuit 5 releases the fixing of the potentials of the word lines WL (2L-n-1), WL (2L-n) to a potential VSS and, at the same time, raises the potentials of the word lines WL (2L-n-1), WL (2L-n) to a potential VREAD.

As has been explained heretofore, according to the second embodiment, in the same manner as the first embodiment, the potentials of the different non-selected word lines WL may be raised to a potential VREAD at different timings. Accordingly, the second embodiment may acquire the same advantageous effects as the first embodiment. Further, according to the second embodiment, the non-selected word lines WL are held in a floating state until charging of the non-selected word lines WL to a potential VREAD is started. Accordingly, at a point of time when charging of the non-selected word lines WL to a potential VREAD is started, the non-selected word lines WL already have a potential higher than a potential VSS by coupling. That is, the difference between the potential at a point of time when the rise of the potential is started and a target potential VREAD is smaller than the corresponding difference in a non-floating state. Accordingly, an amount of rise of a potential of the selected word line WLn by the rise of a potential of the non-selected word line WL is smaller than in a case where the non-selected word line WL is charged to a potential VREAD from a potential VSS. That is, the influence of coupling exerted on the selected word line WLn is small.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a plurality of memory cell transistors including memory cell transistors that are connected to each other in series;
a plurality of word lines that are connected to the plurality of memory cell transistors; and
a control circuit configured to apply a first potential to a selected one of the plurality of word lines, and a second potential that is higher than the first potential to the word lines that are not selected at different timings before the first potential is applied to the selected word line.

2. The semiconductor storage device according to claim 1, wherein
the plurality of word lines are arranged in a matrix configuration such that the non-selected word lines include first and second non-selected word lines that are adjacent to the selected word line on opposite sides of the selected word line, and
the control circuit is configured to apply the second potential to the first and second non-selected word lines at different timings.

3. The semiconductor storage device according to claim 2, wherein
the plurality of word lines extend in a first direction and have a width in a second direction and a thickness in a third direction, and
the first and second non-selected word lines are arranged on opposite sides of the selected word line along the third direction.

4. The semiconductor storage device according to claim 3, wherein
the non-selected word lines include third and fourth non-selected word lines that are adjacent to the selected word line on opposite sides of the selected word line in the second direction, and
the control circuit is configured to apply the second potential to the third and fourth non-selected word lines at the same timing.

5. The semiconductor storage device according to claim 4, wherein
the control circuit is configured to apply the second potential to the first non-selected word line at a first timing, to the second non-selected word line at a second timing that is later than the first timing, and to the third and fourth non-selected word lines at a third timing that is later than the second timing.

6. The semiconductor storage device according to claim 5, wherein
the non-selected word lines include fifth, sixth, seventh, and eighth non-selected word lines that are diagonally adjacent to the selected word line, and
the control circuit is configured to apply the second potential to the fifth, sixth, seventh, and eighth non-selected word lines at a fourth timing that is later than the third timing.

7. The semiconductor storage device according to claim 6, wherein
the control circuit is configured to place the plurality of non-selected word lines into a floating state before the second potential is applied thereto.

8. A semiconductor storage device comprising:
a plurality of memory cell transistors including memory cell transistors that are connected to each other in series;
a plurality of word lines that are connected to the plurality of memory cell transistors and arranged in rows and columns; and
a control circuit configured to apply a first potential to a selected one of the plurality of word lines, and a second potential that is higher than the first potential to the word lines that are not selected at different timings before the first potential is applied to the selected word line, wherein the different timings at which the second potential is applied to each non-selected word line are determined according to a row position of the non-selected word line.

9. The semiconductor storage device according to claim 8, wherein
the plurality of word lines are grouped into multiple groups of adjacent rows and the different timings at which the second potential is applied to each non-selected word line are determined according to which group the non-selected word line belongs.

10. The semiconductor storage device according to claim 9, wherein
the plurality of word lines are stacked above a substrate, and
the non-selected word lines belonging to a first group that is farther from the substrate than a second group, have less number of different timings at which the second potential is applied than the non-selected word lines belonging to the second group.

11. The semiconductor storage device according to claim 9, wherein
the plurality of word lines extend in a first direction and have a width in a second direction and a thickness in a third direction, and the non-selected word lines include first and second non-selected word lines arranged on opposite sides of the selected word line along the third direction, third and fourth non-selected word lines arranged on opposite sides of the selected word line along the second direction, and fifth, sixth, seventh, and eighth non-selected word lines that are diagonally adjacent to the selected word line, and the multiple groups include a first group and a second group, and the second potential is applied to the first through eighth non-selected word lines at three different timings if the first through eighth non-selected word lines are in the first group and at five different timings if the first through eighth non-selected word lines are in the second group.

12. The semiconductor storage device according to claim 11, wherein
the plurality of word lines are stacked above a substrate and the first group is located farther from the substrate than the second group.

13. The semiconductor storage device according to claim 12, wherein
the control circuit is configured to place the plurality of non-selected word lines into a floating state before the second potential is applied thereto.

* * * * *